（12） United States Patent
Kosaka et al.

(10) Patent No.: US 9,326,412 B2
(45) Date of Patent: Apr. 26, 2016

(54) BICYCLE ELECTRIC CONTROL DEVICE

(71) Applicant: SHIMANO INC., Sakai-ku, Sakai, Osaka (JP)

(72) Inventors: Kentaro Kosaka, Sakai (JP); Nobukatsu Hara, Sakai (JP); Michihiro Kodama, Sakai (JP)

(73) Assignee: SHIMANO INC., Sakai, Osaka (JP)

( * ) Notice: Subject to any disclaimer, the term of this patent is extended or adjusted under 35 U.S.C. 154(b) by 545 days.

(21) Appl. No.: 13/679,403

(22) Filed: Nov. 16, 2012

(65) Prior Publication Data
US 2014/0139977 A1  May 22, 2014

(51) Int. Cl.
A47B 96/06 (2006.01)
H05K 7/14 (2006.01)
B62K 23/06 (2006.01)
B62K 23/02 (2006.01)

(52) U.S. Cl.
CPC ........ *H05K 7/14* (2013.01); *B62K 23/02* (2013.01); *B62K 23/06* (2013.01)

(58) Field of Classification Search
CPC .. B62J 11/00; B62M 25/02; B62M 2025/003; H05K 7/14
USPC ............... 248/229.14, 230.4, 231.61, 288.31; 224/401, 420, 426, 445, 446, 448, 913
See application file for complete search history.

(56) References Cited

U.S. PATENT DOCUMENTS

| 6,029,874 | A  | * | 2/2000 | Meggitt | 224/412 |
| 6,331,089 | B1 | * | 12/2001 | Iteya | 403/56 |
| 6,400,564 | B1 | * | 6/2002 | Nishimoto et al. | 361/679.01 |
| 6,774,771 | B2 | * | 8/2004 | Takeda | 340/432 |
| 7,854,180 | B2 |   | 12/2010 | Tetsuka | |
| 9,073,596 | B2 |   | 7/2015 | McLaughlin et al. | |
| 2007/0069101 | A1 | * | 3/2007 | Shevin-Sandy | 248/441.1 |
| 2009/0071992 | A1 | * | 3/2009 | Franz | 224/420 |
| 2012/0187169 | A1 | * | 7/2012 | Osten et al. | 224/414 |

FOREIGN PATENT DOCUMENTS

| DE | 60205173 T2 | 7/2006 |
| EP | 0615896 A1 | 9/1994 |
| EP | 2562070 A1 | 2/2006 |
| JP | 6-298147 | 10/1994 |
| JP | 3180749 | * 1/2013 ............... B62J 6/02 |

OTHER PUBLICATIONS

Search Report issued in 102013017606.9 by the German Patent and Trademark Office on Jul. 30, 2015.

* cited by examiner

*Primary Examiner* — Gwendolyn Baxter
(74) *Attorney, Agent, or Firm* — Jeffer Mangels; Butler & Mitchell LLP; Brennan C. Swain, Esq.

(57) ABSTRACT

An electric control device for a bicycle that includes a base member mountable to a bicycle handlebar, a first electric user interface member operatively coupled to the base member, and a second electric user interface member operatively coupled to the base member. The first electric user interface member and the second electric user interface member are adjustable relative to one another.

18 Claims, 6 Drawing Sheets

BICYCLE ELECTRIC CONTROL DEVICE

FIELD OF THE INVENTION

The present invention relates to a bicycle electric control device, and more specifically to a bicycle electric control device that includes rotatably or slidably adjustable user interface members.

BACKGROUND OF THE INVENTION

There are known bicycle control devices for controlling various aspects of the bicycle, such as shifting or braking. For example, many shifting devices are electric powered and configured such that they can be controlled electrically so as to change among a plurality of gear positions (e.g., U.S. Pat. No. 7,854,180 to Tetsuka, the entirety of which is incorporated herein by reference). These types of devices include electric switches and can be mounted to a handlebar. However, due to the differences in size of riders' hands, it is desirable to provide adjustability of the positioning of the user interface devices or switches.

In view of the above, there exists a need for an improved bicycle electric control device. This invention addresses this need in the art as well as other needs, which will become apparent from this disclosure to those skilled in the art.

SUMMARY OF THE PREFERRED EMBODIMENTS

In accordance with a first aspect of the present invention there is provided an electric control device for a bicycle that includes a base member mountable to a bicycle handlebar, a first electric user interface member operatively coupled to the base member, and a second electric user interface member operatively coupled to the base member. The first electric user interface member and the second electric user interface member are adjustable relative to one another. In a preferred embodiment, the base member includes a clamp member that is adapted to be attached to the handlebar and a bracket member on which the first and second electric user interface members are mounted. In a preferred embodiment, the first and/or second electric user interface member is rotatably adjustable with respect to the bracket member. In a preferred embodiment, the first and/or second electric user interface member is slidably adjustable with respect to the bracket member. In a preferred embodiment, the first and/or second electric user interface member is slidably and/or rotatably adjustable with respect to the bracket member.

In a preferred embodiment, one of the first electric user interface member and the bracket member includes a first spherical recess and the other of the first electric user interface member and the bracket member includes a first spherical protrusion that is received in the first spherical recess. The interaction of the first spherical recess and the first spherical protrusion provides for adjustability of the position of the first electric user interface member. In a preferred embodiment, one of the second electric user interface member and the bracket member includes a second spherical recess and the other of the second electric user interface member and the bracket member includes a second spherical protrusion that is received in the second spherical recess. The interaction of the second spherical recess and the second spherical protrusion provides for adjustability of the position of the second electric user interlace member. Preferably, the base member includes a first adjustment opening defined therein and the first spherical protrusion includes a first adjustment bore defined therein, and a first threaded fastener extends through the first adjustment opening and is received in the first adjustment bore. Preferably, the base member also includes a second adjustment opening defined therein and the second spherical protrusion includes a second adjustment bore defined therein, and a second threaded fastener extends through the second adjustment opening and is received in the second adjustment bore. The first threaded fastener, first adjustment opening and first adjustment bore are configured to provide adjustability of the position of the first electric user interface member, and the second threaded fastener, second adjustment opening and second adjustment bore are configured to provide adjustability of the position of the second electric user interface member.

In a preferred embodiment, the base member includes a first elongated bore defined therein, and the first electric user interface member includes a first threaded fastener that extends through the first elongated bore. The first threaded fastener and first elongated bore are configured to provide adjustability of the position of the first electric user interface member. Preferably, the base member includes a second elongated bore defined therein, and the second electric user interface member includes a second threaded fastener that extends through the second elongated bore. The second threaded fastener and second elongated bore are configured to provide adjustability of the position of the second electric user interface member.

In a preferred embodiment, the base member includes at least first and second openings defined therein, and the first electric user interface member includes a first threaded fastener that extends through the first opening. The first threaded fastener can be disposed in the second opening to adjust the position of the first electric user interface member. Preferably, the base member includes at least third and fourth openings defined therein, and the second electric user interface member includes a second threaded fastener that extends through the third opening. The second threaded fastener can be disposed in the fourth opening to adjust the position of the second electric user interface member.

In a preferred embodiment, the base member includes a first portion for coupling the first electric user interface member and a second portion for coupling the second electric user interface member, and the first portion and the second portion are offset with respect to one another. Preferably, the first portion and the second portion are offset in one or both of a generally perpendicular direction or a generally parallel direction with respect to an axis defined by the bicycle handlebar when the electric control device is mounted on the bicycle handlebar.

The invention, together with additional features and advantages thereof, may be best understood by reference to the following description.

DETAILED DESCRIPTION OF THE PREFERRED EMBODIMENTS

Figure 1:
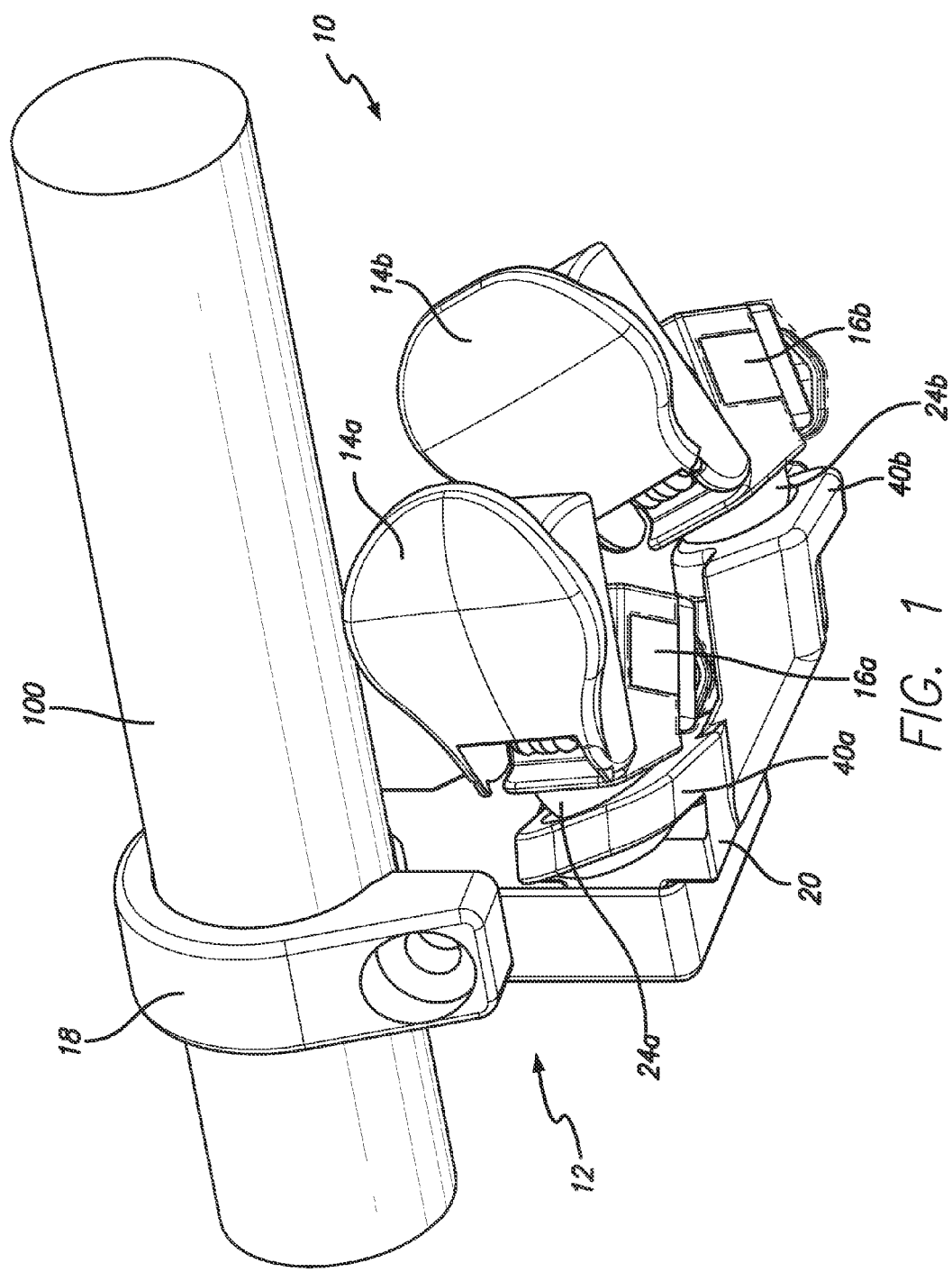
FIG. 1 is a perspective view of a bicycle electric control device with first and second user interface members in accordance with a preferred embodiment of the present invention.

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Referring initially to FIGS. 1-4, an electric control device 10 for a bicycle is illustrated in accordance with an embodiment of the present invention. In a preferred embodiment, the electric control device generally includes a base member 12 that is mountable to a handlebar 100 of the bicycle, a first electric user interface member 14a that is operatively coupled to the base member 12, and a second electric user interface member 14b that is operatively coupled to the base member 12. In a preferred embodiment, the first electric user interface member 14a and the second electric user interface member 14b are adjustable relative to one another. The first and second electric user interface members 14a and 14b include first and second switch units 16a and 16b therein (shown in dashed lines in FIG. 1), respectively. Preferably, the first and second user interface members 14a and 14b include pivotal actuation. However, this is not a limitation on the present invention and other forms of switch actuation can be used (e.g., push button). Switch units and user interface members are known and, therefore, a description thereof will be omitted herein.

Preferably, the base member 12 includes a clamp member 18 that is adapted to be attached to the handlebar 100 and a bracket member 20 on which the first and second electric user interface members 14a and 14b are mounted. The clamp member 18 and bracket member 20 can be unitary or can be separate pieces.

Figure 2:
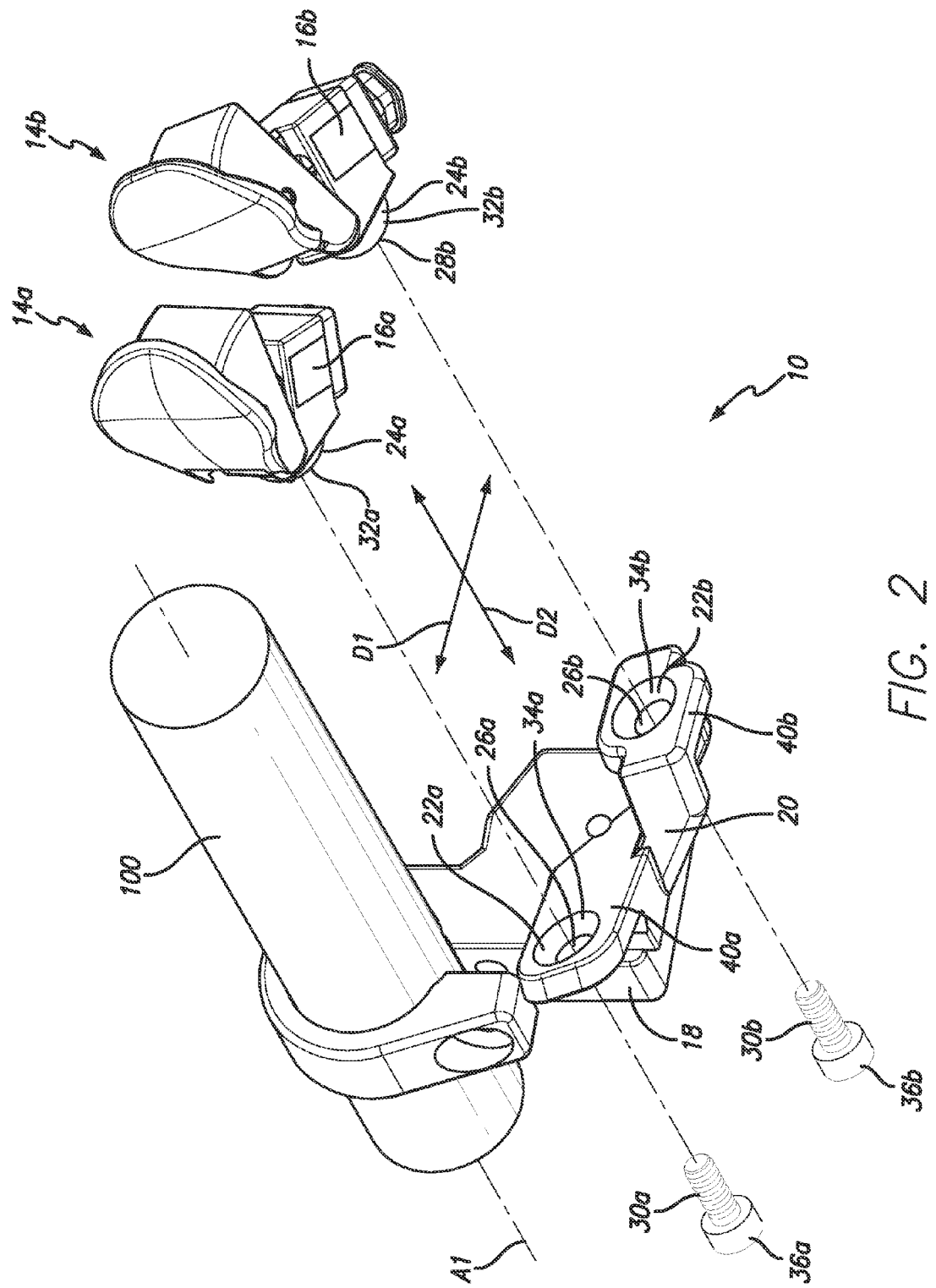
FIG. 2 is an exploded view of the bicycle electric control device of FIG. 1 showing the first and second user interface members exploded therefrom.
Figure 3:
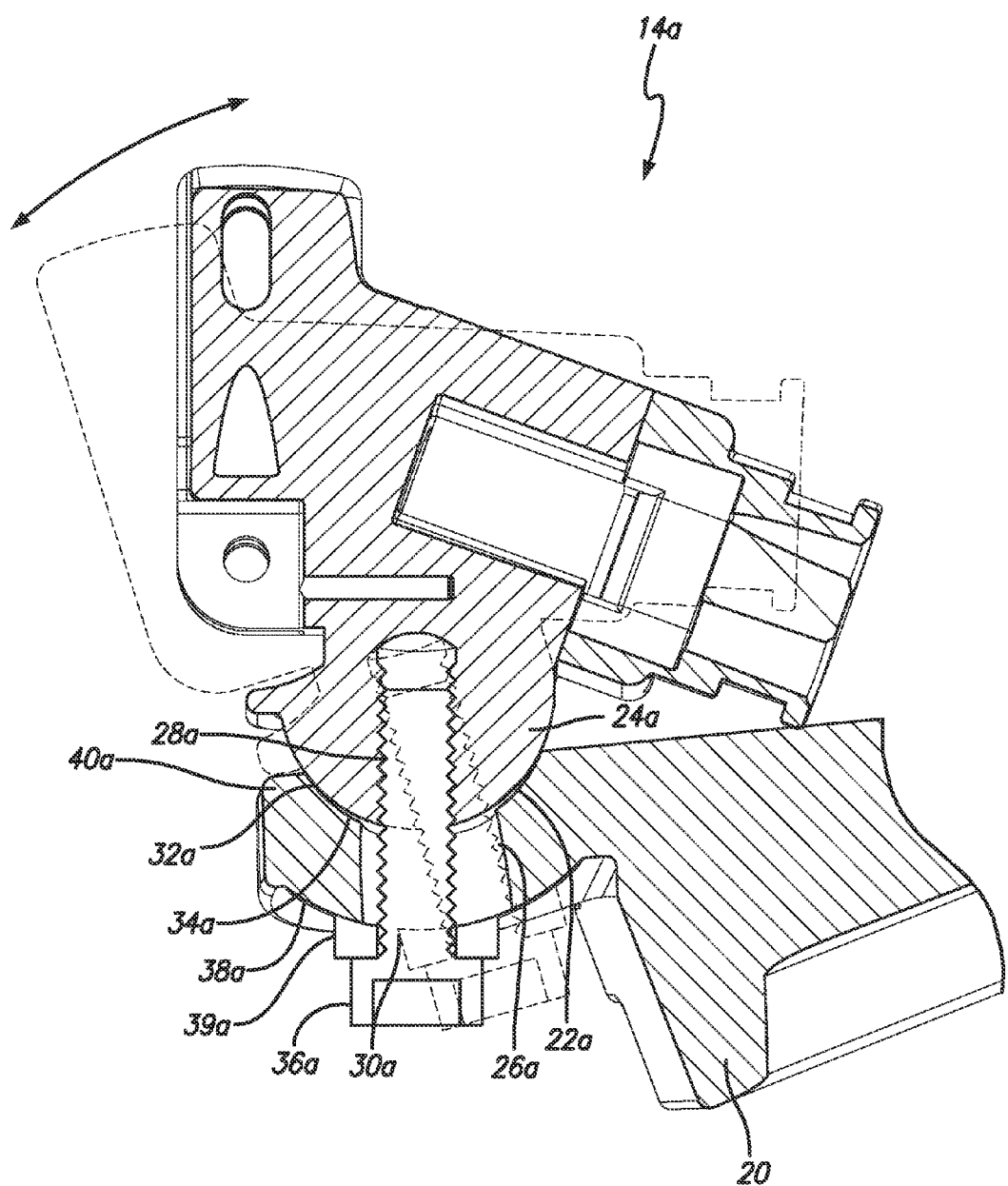
FIG. 3 is a cross-sectional elevational view taken through the first user interface member and adjacent portion of the base member, and showing the first user interface member in an adjusted position in hidden lines.
Figure 4:
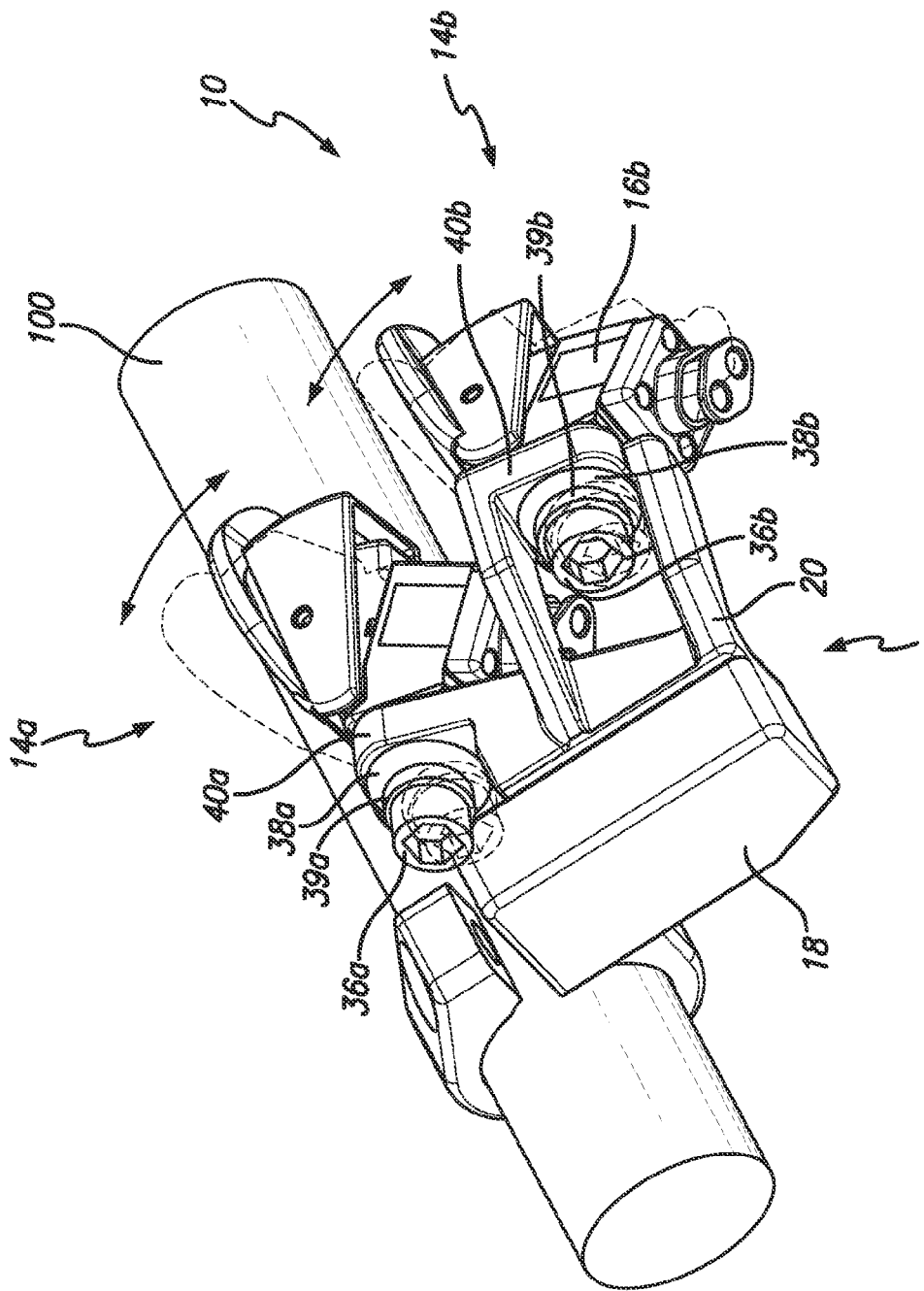
FIG. 4 is a perspective view of the bicycle electric control device of FIG. 1 showing the first and second threaded fasteners in adjusted positions in hidden lines.

As shown in FIGS. 2-3, in a preferred embodiment, the bracket member 20 includes first and second spherical recesses 22a and 22b defined therein. The first and second electric user interface members include first and second spherical protrusions 24a and 24b extending therefrom that are received in the first and second spherical recesses 22a and 22b, respectively. As shown in FIG. 3, the first spherical recess 22a includes a first adjustment opening 26a defined therein. The first spherical protrusion 24a includes a first adjustment bore 28a defined therein. A first threaded fastener 30a extends through the first adjustment opening 26a and into the first adjustment bore 28a. As shown in FIGS. 3-4, to adjust the position of the first electric user interface member 14a, the first threaded fastener 30a is loosened and the first electric user interface member 14a is slidably and/or rotatably adjusted as desired and then the first threaded fastener 30a is tightened in place. It will be appreciated by those skilled in the art, that this provides adjustment within 360 degrees due to the circular/spherical shape of the first spherical recess 22a and first spherical protrusion 24a. When adjustment is made, the outer surface 32a of the first spherical protrusion 24a slides and/or rotates against or with respect to the inner surface 34a of the first spherical recess 22a. As shown in FIGS. 3-4, the first threaded fastener 30a includes a head 36a and a first washer 39a, through which the first threaded fastener 30a passes, that are disposed on a first domed surface 38a that surrounds the first adjustment opening 26a. The first washer 39a has a spherical recess that mates with the first domed surface 38a. When adjustment is made, the first washer 39a slides against or moves with respect to the first domed surface 38a together with the first threaded fastener 30a, as is shown in FIG. 3.

The second spherical recess 22b includes a second adjustment opening 26b defined therein. The second spherical protrusion 24b includes a second adjustment bore 28b defined therein. A second threaded fastener 30b extends through the second adjustment opening 26b and into the second adjustment bore 28b. It will be appreciated that adjustment of the position of the second electric user interface member 14b is similar to the adjustment of the first electric user interface member 14a described above. When adjustment is made, the outer surface 32b of the second spherical protrusion 24b slides and/or rotates against or with respect to the inner surface 34b of the second spherical recess 22b. As shown in FIGS. 3-4, the second threaded fastener 30b includes a head 36b and a second washer 39b, through which the second threaded fastener 30b passes, that are disposed on a second domed surface 38b that surrounds the second adjustment opening 26b. Similar to the first washer 39a, the second washer 39b has a spherical recess that mates with the second domed surface 38b. When adjustment is made, the second washer 39b slides against or moves with respect to the second domed surface 38b together with the second threaded fastener 30b. It will be understood by those of skill in the art, that the arrangement described above can provide at least one of slidable adjustment and rotatable adjustment of the first and second electric user interface members 14a and 14b with respect to the bracket member 20.

As shown in FIGS. 1-4, in a preferred embodiment, base member 12, and, in particular, the bracket 20 includes a first portion 40a for coupling the first electric user interface member 14a and a second portion 40b for coupling the second electric user interface member 14b. The first and second spherical recesses 22a and 22b are defined in first and second portions 40a and 40b, respectively.

As shown best in FIG. 2, the first and second portions 40a and 40b are offset with respect to one another. Furthermore, as shown in FIG. 2, in a preferred embodiment, the first and second portions 40a and 40b are offset in a generally perpendicular direction D1 with respect to an axis A1 defined by the bicycle handlebar and are offset in a generally parallel direction D2 with respect to axis A1. Put another way, as a result of this offset relationship, the first and second adjustment openings 26a and 26b are offset in a generally perpendicular direction D1 with respect to an axis A1 defined by the bicycle handlebar and are offset in a generally parallel direction D2 with respect to axis A1. In another embodiment, the first and second portions 40a and 40b are only offset in one of a perpendicular or parallel direction with respect to axis A1.

In another embodiment, the positions of the spherical protrusions and the spherical recesses can be reversed, such that the spherical protrusions extend from the bracket member and the spherical recesses are defined in the electric user interface members.

Figure 5A:
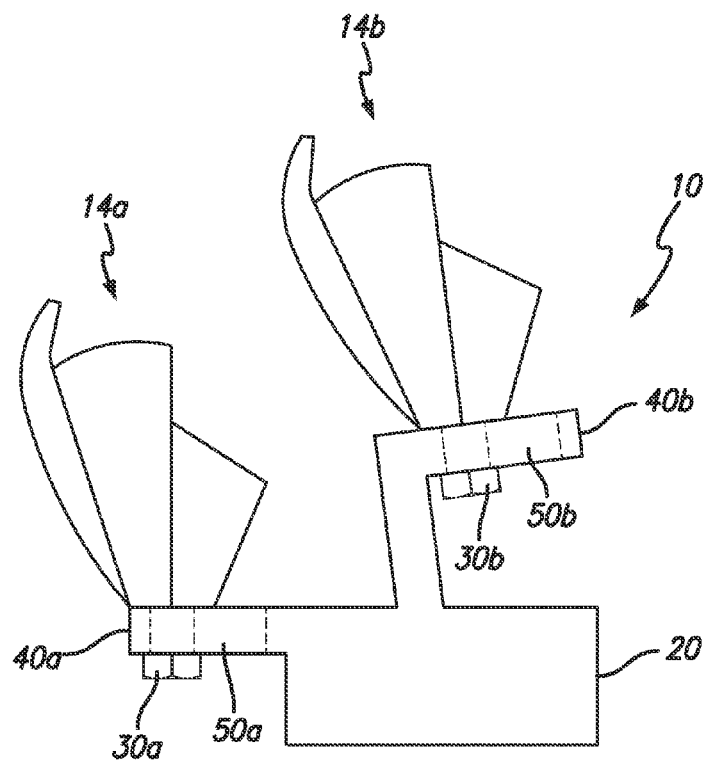
FIG. 5A is a bottom plan view of a bicycle electric control device in accordance with another preferred embodiment of the present invention.
Figure 5B:
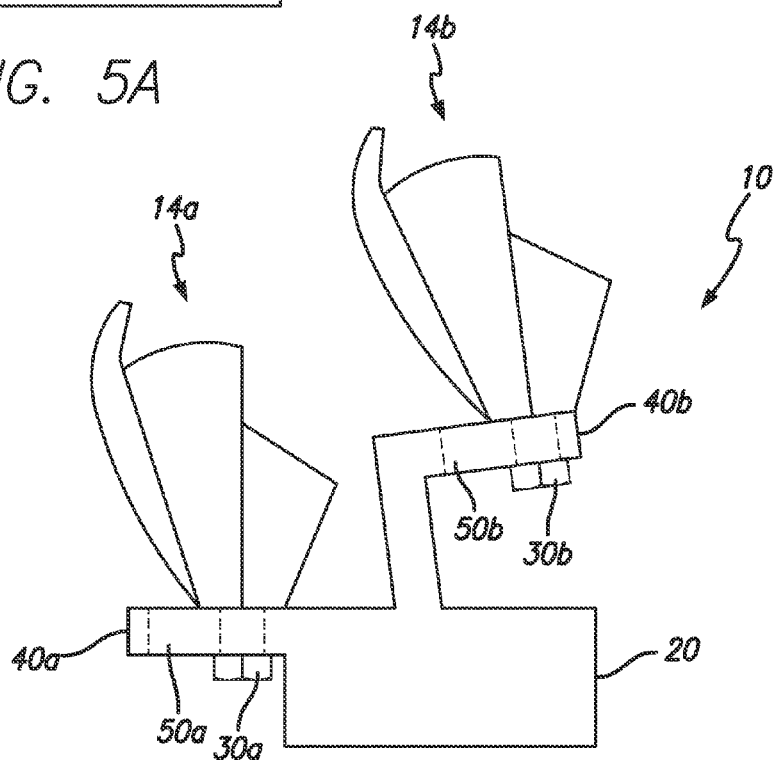
FIG. 5B is a bottom plan view of the bicycle electric control device of FIG. 5A with the position of the first and second user interface members adjusted along the first and second elongated bores.

FIGS. 5A-5B show another embodiment of the present invention. In this embodiment, the bracket member 20 includes first and second elongated bores 50a and 50b defined therein through which the first and second threaded fasteners 30a and 30b extend. In this embodiment, to adjust the position of the first electric user interface member 14a, the first threaded fastener 30a is loosened, and the first electric user interface member 14a is slid along first elongated bore 50a to the desired position and then the first threaded fastener 30a is tightened. In another embodiment, the threaded fastener 30a is integral with the first electric user interface member 14a and extends through the elongated bore 50a and a nut is received on the end of the threaded fastener 30a to secure it in position. The position of second electric user interface member 14b can be adjusted similarly. In another embodiment, the adjustment provided by the spherical recess and spherical protrusion can be combined with the slidable adjustment provided by the elongated bores.

Figure 6A:
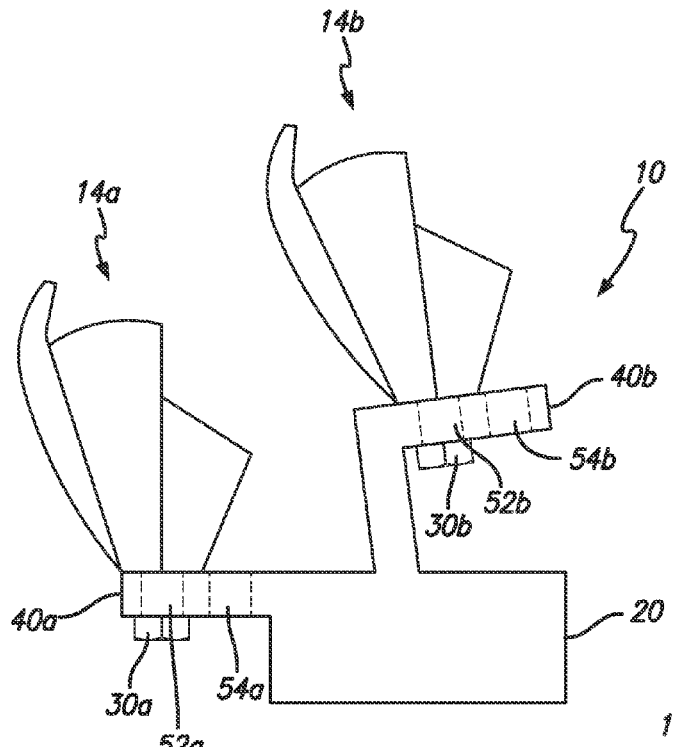
FIG. 6A is a bottom plan view of a bicycle electric control device in accordance with yet another preferred embodiment of the present invention.
Figure 6B:
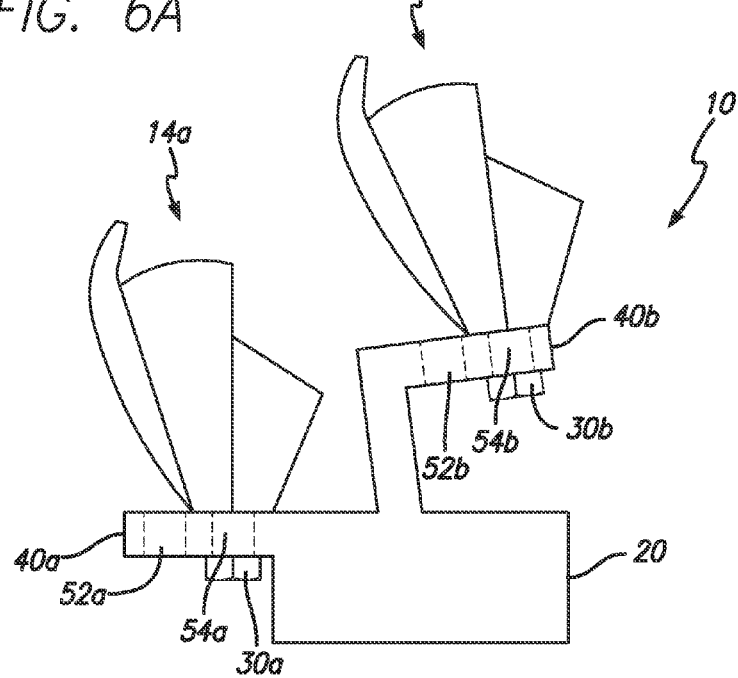
FIG. 6B is a bottom plan view of the bicycle electric control device of FIG. 6A with the position of the first and second user interface members adjusted by moving them into different openings.

As shown in FIGS. 6A and 6B, in another embodiment, the position of first electric user interface member 14a can be adjusted by moving first threaded fastener member 30a between a plurality of openings. As shown in FIGS. 6A and 6B, in a preferred embodiment, the bracket member 20 includes at least first and second openings 52a and 54a defined therein. The position of the first electric user interface member 14a is adjusted by removing the first threaded fastener 30a from first opening 52a, and inserting it into second opening 54a (and securing first electric user interface member 14a in place). In another embodiment, the threaded fastener 30a is integral with the first electric user interface member 14a and extends through one of the first or second openings 52a and 54a and a nut is received on the end of the threaded fastener 30a to secure it in position. The position of second electric user interface member 14b is adjusted similarly using third and fourth openings 52b and 54b. In another embodiment, the adjustment provided by the spherical recess and spherical protrusion can be combined with the slidable/movable adjustment provided by the plurality of openings.

It will be appreciated that other adjustment combinations are within the scope of the present invention. For example, in a preferred embodiment, only one of the first electric user interface member 14a and the second electric user interface member 14b may be adjustable with respect to the base member 12.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including," "having" and their derivatives. Also, the terms "part," "section," "portion," "member" or "element" when used in the singular can have the dual meaning of a single part or a plurality of parts. As used herein to describe the above embodiment(s), the following directional terms "forward," "rearward," "rightward," "leftward," "outward," "inward," "downward," "upward," "above," "below," "vertical," "horizontal," and "transverse" as well as any other similar directional terms refer to those directions of a bicycle equipped with the bicycle control device. Accordingly, these terms, as utilized to describe the bicycle control device should be interpreted relative to a bicycle equipped with the bicycle control device as used in the normal riding position on a level surface. Finally, terms of degree such as "substantially," "about" and "approximately" as used herein mean a reasonable amount of deviation of the modified term such that the end result is not significantly changed.

While certain aspects of the disclosure are presented below in certain claim forms, the inventors contemplate the various aspects of the disclosure in any number claim forms. For example, while only one aspect of the disclosure is recited as a means-plus-function claim under 35 U.S.C. §112, ¶6, other aspects may likewise be embodied as a means-plus-function claim, or in other forms, such as being embodied in a computer-readable medium. (Any claims intended to be treated under 35 U.S.C. §112, ¶6 will begin with the words "means for"). Accordingly, the applicant reserves the right to add additional claims after filing the application to pursue such additional claim forms for other aspects of the disclosure.

Accordingly, although exemplary embodiments of the invention have been shown and described, it is to be understood that all the terms used herein are descriptive rather than limiting, and that many changes, modifications, and substitutions may be made by one having ordinary skill in the art without departing from the spirit and scope of the invention.

What is claimed is:

1. An electric control device for a bicycle, the electric control device comprising:
   a base member that includes a clamp member that is adapted to be attached to a bicycle handlebar,
   a first electric user interface member operatively coupled to the base member, wherein the first electric user interface member includes a first switch unit, and
   a second electric user interface member operatively coupled to the base member, wherein the second electric user interface member includes a second switch unit,
   wherein the first electric user interface member and the second electric user interface member are adjustable relative to one another, wherein the base member includes a bracket member on which the first and second electric user interface members are mounted, wherein one of the first electric user interface member and the bracket member includes a first spherical recess and the other of the first electric user interface member and the bracket member includes a first spherical protrusion that is received in the first spherical recess, and wherein the interaction of the first spherical recess and the first spherical protrusion provides for adjustability of the position of the first electric user interface member.

2. The electric control device of claim 1 wherein the first electric user interface member is rotatably adjustable with respect to the bracket member.

3. The electric control device of claim 2 wherein the first electric user interface member is slidably adjustable with respect to the bracket member.

4. The electric control device of claim 1 wherein the first electric user interface member is slidably adjustable with respect to the bracket member.

5. The electric control device of claim 1 wherein the second electric user interface member is rotatably adjustable with respect to the bracket member.

6. The electric control device of claim 5 wherein the second electric user interface member is slidably adjustable with respect to the bracket member.

7. The electric control device of claim 1 wherein the second electric user interface member is slidably adjustable with respect to the bracket member.

8. The electric control device of claim 1 wherein the one of the second electric user interface member and the bracket member includes a second spherical recess and the other of the second electric user interface member and the bracket member includes a second spherical protrusion that is received in the second spherical recess, wherein the interaction of the second spherical recess and the second spherical protrusion provides for adjustability of the position of the second electric user interface member.

9. The electric control device of claim 8 wherein the first spherical recess is defined in the bracket member and the first spherical protrusion extends from the first electric user interface member, and wherein the second spherical recess is defined in the bracket member and the second spherical protrusion extends from the second electric user interface member.

10. The electric control device of claim 9 wherein the bracket member includes a first adjustment opening defined therein and the first spherical protrusion includes a first adjustment bore defined therein, wherein a first threaded fastener extends through the first adjustment opening and is received in the first adjustment bore, wherein the bracket member includes a second adjustment opening defined therein and the second spherical protrusion includes a second adjustment bore defined therein, wherein a second threaded fastener extends through the second adjustment opening and is received in the second adjustment bore, wherein the first threaded fastener, first adjustment opening and first adjustment bore are configured to provide adjustability of the position of the first electric user interface member, and the second threaded fastener, second adjustment opening and second adjustment bore are configured to provide adjustability of the position of the second electric user interface member.

11. The electric control device of claim 1 wherein the base member includes a first portion for coupling the first electric user interface member and a second portion for coupling the second electric user interface member, the first portion and the second portion being offset with respect to one another.

12. The electric control device of claim 11 wherein the first portion and the second portion are offset with respect to one another in a generally perpendicular direction with respect to an axis defined by the bicycle handlebar when the electric control device is mounted on the bicycle handlebar.

13. The electric control device of claim 12 wherein the first portion and the second portion are offset with respect to one another in a generally parallel direction with respect to an axis defined by the bicycle handlebar when the electric control device is mounted on the bicycle handlebar.

14. The electric control device of claim 11 wherein the first portion and the second portion are offset with respect to one another in a generally parallel direction with respect to an axis defined by the bicycle handlebar when the electric control device is mounted on the bicycle handlebar.

15. An electric control device for a bicycle, the electric control device comprising:
a base member mountable to a bicycle handlebar, wherein the base member includes a first elongated bore defined therein,
a first electric user interface member operatively coupled to the base member, wherein the first electric user interface member includes a first threaded fastener defining a first axis that extends through the first elongated bore, and wherein the first threaded fastener is movable along the first elongated bore in a direction that is generally perpendicular to the first axis to provide adjustability of the position of the first electric user interface member, and
a second electric user interface member operatively coupled to the base member.

16. The electric control device of claim 15 wherein the base member includes a second elongated bore defined therein, wherein the second electric user interface member includes a second threaded fastener defining a second axis that extends through the second elongated bore, wherein the second threaded fastener is movable along the second elongated bore in a direction that is generally perpendicular to the first axis to provide adjustability of the position of the second electric user interface member.

17. An electric control device for a bicycle, the electric control device comprising:
a base member mountable to a bicycle handlebar, wherein the base member includes at least first and second openings defined therein,
a first electric user interface member operatively coupled to the base member, wherein the first electric user interface member includes a first threaded fastener that extends through the first opening, whereby the first threaded fastener can be disposed in the second opening to adjust the position of the first electric user interface member, and
a second electric user interface member operatively coupled to the base member.

18. The electric control device of claim 17 wherein the base member includes at least third and fourth openings defined therein, wherein the second electric user interface member includes a second threaded fastener that extends through the third opening, whereby the second threaded fastener can be disposed in the fourth opening to adjust the position of the second electric user interface member.

* * * * *